(12) United States Patent
Torrents Abad et al.

(10) Patent No.: US 11,670,531 B2
(45) Date of Patent: Jun. 6, 2023

(54) BRIDGE PICK-UP HEAD FOR TRANSFERRING SEMICONDUCTOR DEVICES

(71) Applicant: Meta Platforms Technologies, LLC, Menlo Park, CA (US)

(72) Inventors: Oscar Torrents Abad, Cork (IE); Daniel Brodoceanu, Cork (IE); Ali Sengül, Zurich (CH); Pooya Saketi, Cork (IE)

(73) Assignee: Meta Platforms Technologies, LLC, Menlo Park, CA (US)

( * ) Notice: Subject to any disclaimer, the term of this patent is extended or adjusted under 35 U.S.C. 154(b) by 606 days.

(21) Appl. No.: 16/682,545

(22) Filed: Nov. 13, 2019

(65) Prior Publication Data
US 2020/0343121 A1    Oct. 29, 2020

Related U.S. Application Data

(60) Provisional application No. 62/838,868, filed on Apr. 25, 2019.

(51) Int. Cl.
*H01L 21/68*    (2006.01)
*H01L 21/683*   (2006.01)
(Continued)

(52) U.S. Cl.
CPC .......... *H01L 21/683* (2013.01); *B65G 47/90* (2013.01); *H01L 33/00* (2013.01)

(58) Field of Classification Search
CPC ........ H01L 21/683; H01L 33/00; B65G 47/90
(Continued)

(56) References Cited

U.S. PATENT DOCUMENTS 6,954,272 B2 * 10/2005 Lam .................. G01B 11/00
                                             356/138
11,004,721 B2 * 5/2021 Hsiang ............. H01L 21/67712
(Continued)

FOREIGN PATENT DOCUMENTS

EP    3425618 A1    1/2019
JP    2011086698 A  4/2011
TW    I633618 B     8/2018

OTHER PUBLICATIONS

PCT International Search Report and Written Opinion, PCT Application No. PCT/US2020/029088, dated Oct. 16, 2020, 13 pages.
(Continued)

*Primary Examiner* — Peter Dungba Vo
*Assistant Examiner* — Azm A Parvez
(74) *Attorney, Agent, or Firm* — Fenwick & West LLP

(57) ABSTRACT

A pick-up tool (PUT) includes a bridge pick-up head. The bridge pick-up head includes: a first bridge leg portion, a second bridge leg portion, and a bridge center portion between the first and second leg portions, the first and second bridge leg portions each including a top surface and side surfaces, the top surfaces of the first and second bridge leg portions extending above the bridge center portion; a bridge base portion on the bridge center portion, the bridge base portion including a bottom side on the bridge center portion, a top side that is smaller than the bottom side, and one or more sloped surfaces defined between the top and bottom sides; and a tip configured to attach with a semiconductor device on the top side of the bridge base portion.

16 Claims, 12 Drawing Sheets

(51) Int. Cl.
*B65G 47/90* (2006.01)
*H01L 33/00* (2010.01)

(58) Field of Classification Search
USPC ...... 29/832, 829, 825, 592.1, 739, 740, 700, 29/729, 757
See application file for complete search history.

(56) References Cited

U.S. PATENT DOCUMENTS

| | | |
|---|---|---|
| 2003/0133116 A1 | 7/2003 | Lam et al. |
| 2004/0252251 A1* | 12/2004 | Credelle ............. H01L 29/0657 |
| | | 257/E29.022 |
| 2010/0123268 A1* | 5/2010 | Menard .................. H01L 24/97 |
| | | 264/293 |
| 2012/0126395 A1 | 5/2012 | Lee et al. |
| 2013/0300812 A1* | 11/2013 | Bibi ..................... B81C 99/002 |
| | | 347/159 |
| 2014/0324221 A1 | 10/2014 | Chisholm et al. |
| 2015/0268026 A1 | 9/2015 | Sugawara et al. |
| 2015/0360940 A1 | 12/2015 | Bathurst et al. |
| 2017/0141115 A1* | 5/2017 | Bower ................... H01L 28/40 |
| 2018/0158704 A1 | 6/2018 | Saketi et al. |
| 2018/0158706 A1 | 6/2018 | Hsu et al. |
| 2018/0342643 A1 | 11/2018 | Lu et al. |
| 2019/0206714 A1 | 7/2019 | Hsiang et al. |

OTHER PUBLICATIONS

Non-Final Office Action dated Aug. 5, 2022 for U.S. Appl. No. 16/728,677, filed Dec. 27, 2019, 16 pages.

* cited by examiner

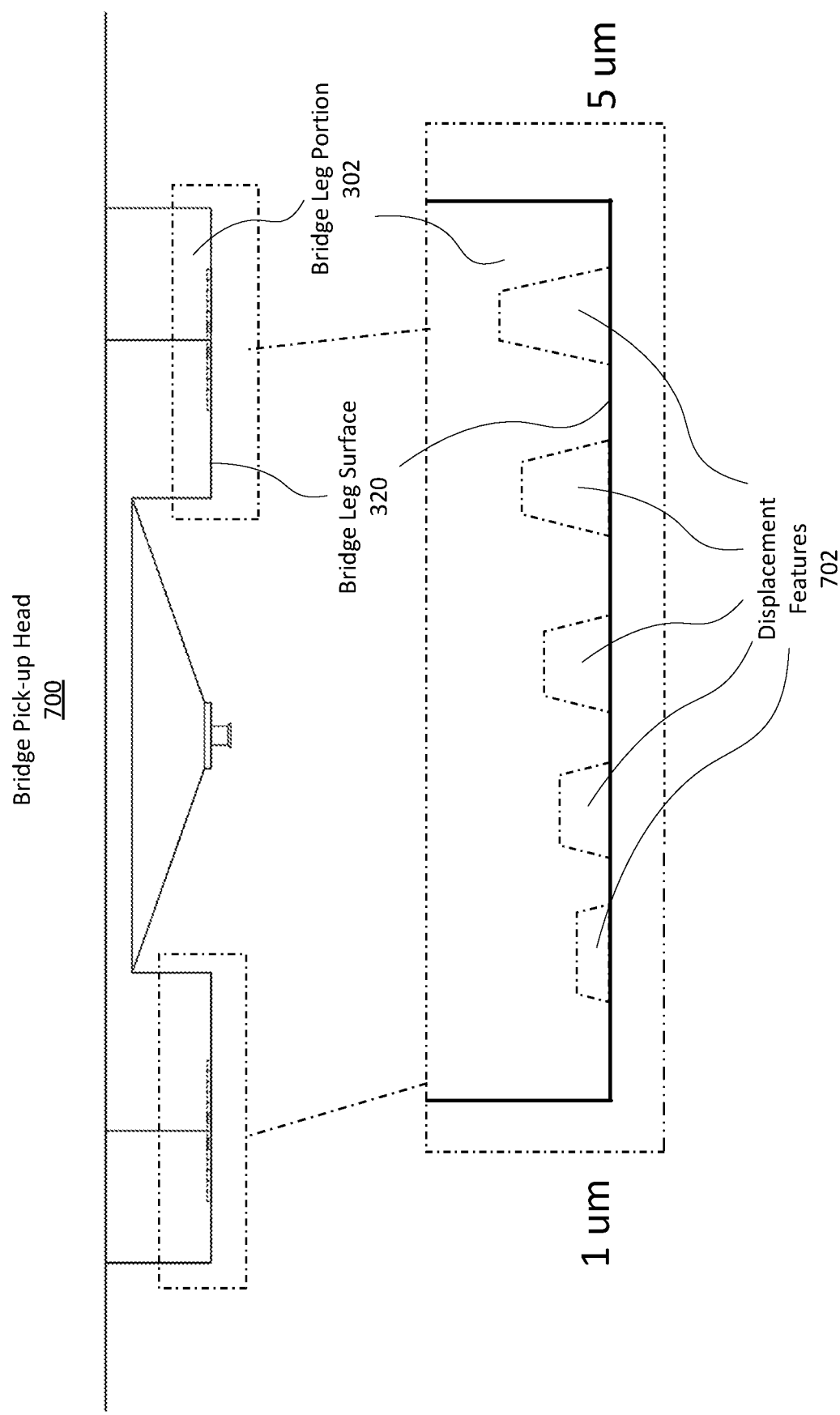

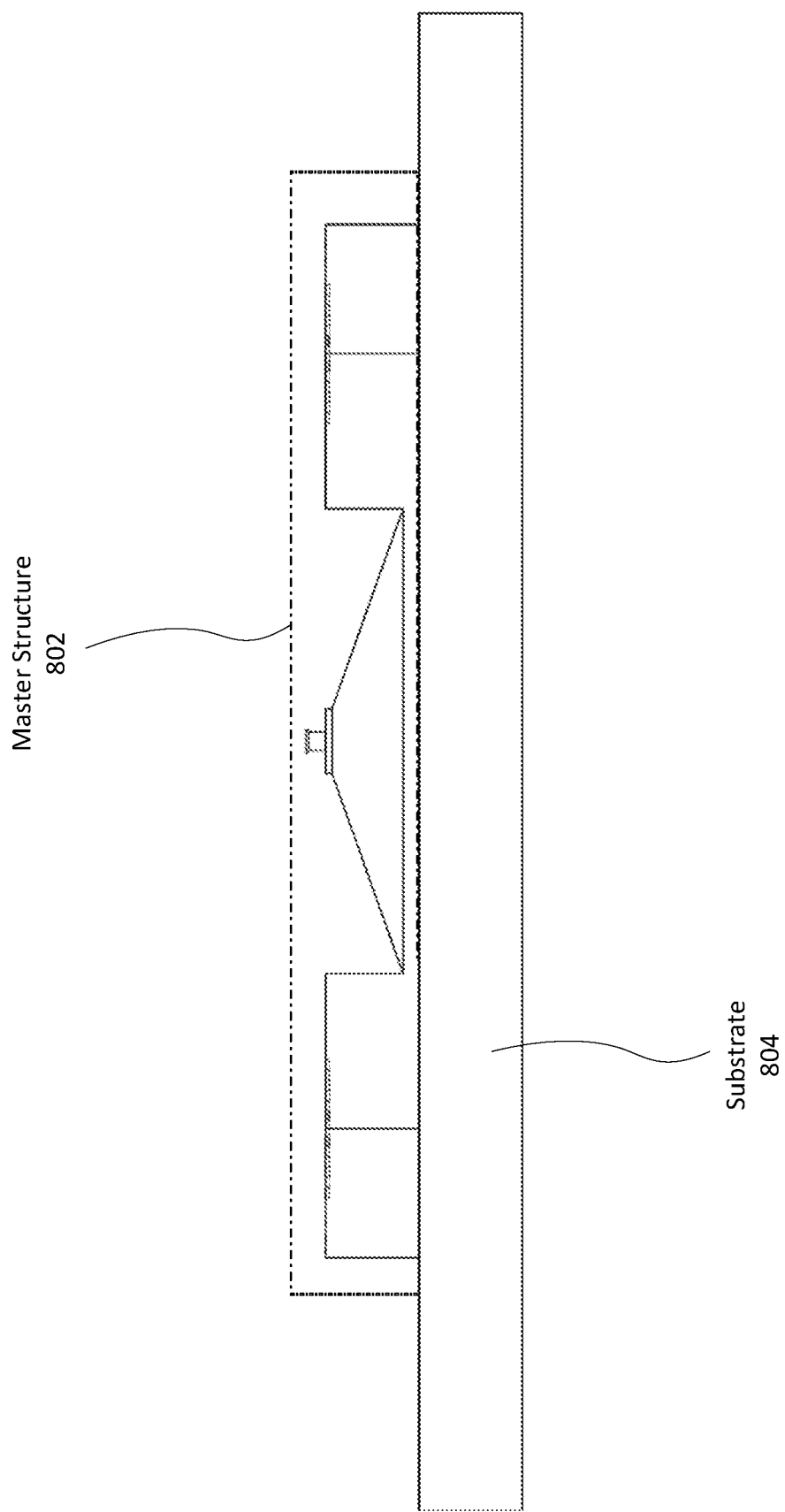

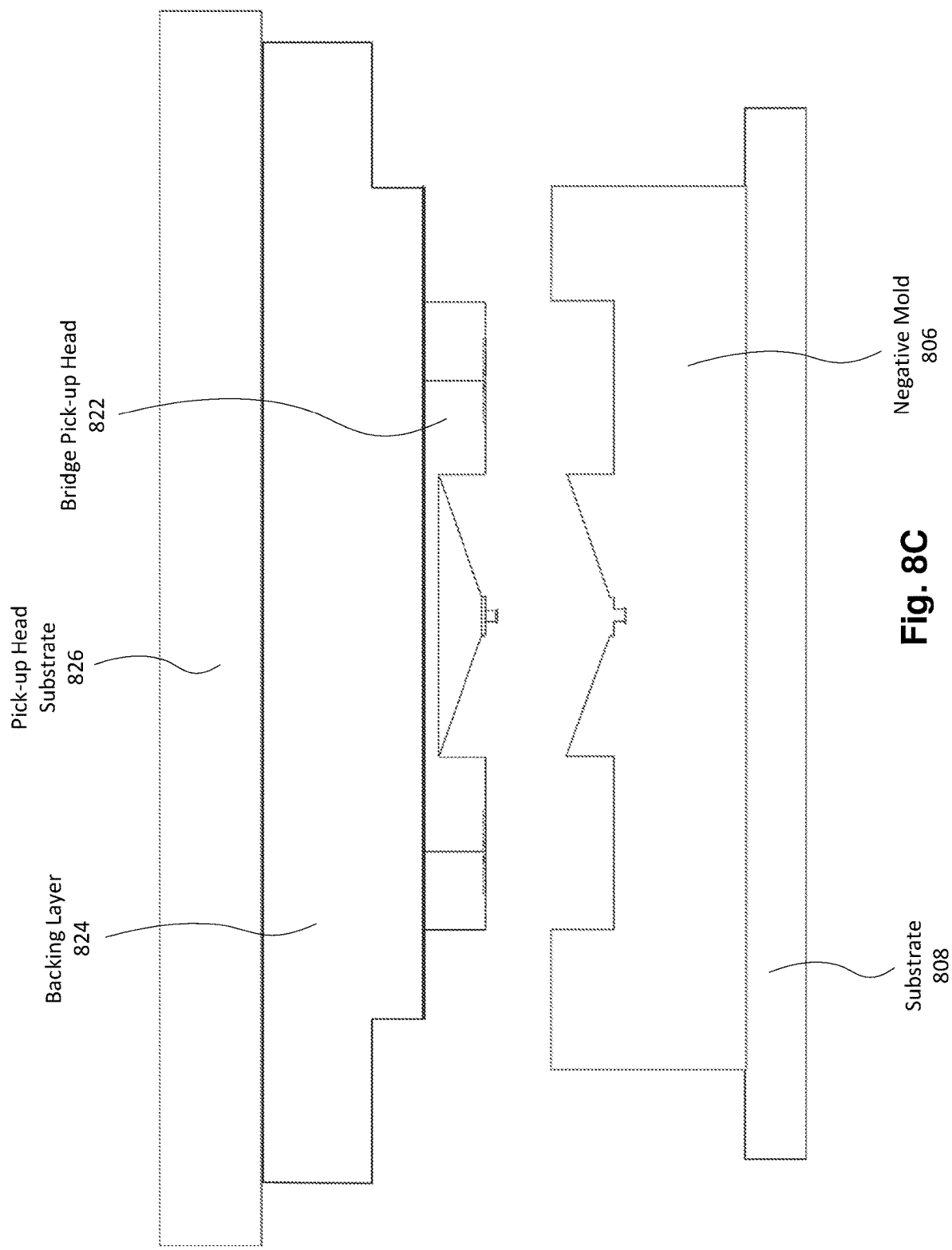

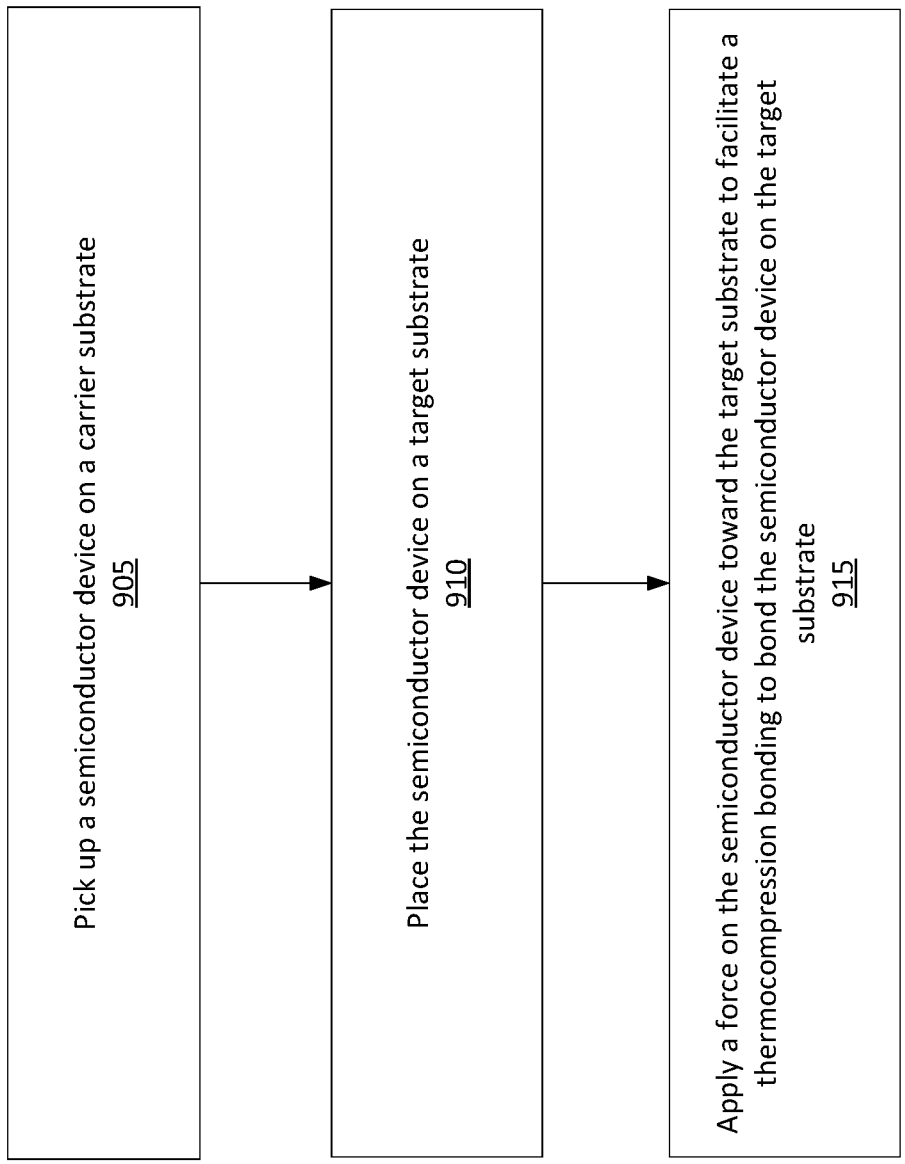

BRIDGE PICK-UP HEAD FOR TRANSFERRING SEMICONDUCTOR DEVICES

CROSS REFERENCE TO RELATED APPLICATION

This application claims the benefit of U.S. Provisional Application No. 62/838,868, filed Apr. 25, 2019, which is incorporated by reference in its entirety.

BACKGROUND

The present disclosure relates to manufacture of small display elements that are transferred from an initial substrate to a receiving substrate using a pick and place transfer process.

To populate a display with very small light emitting diodes (LEDs), such as micro-LEDs (μLEDs), there may be a need to transfer the LEDs from a native substrate on which they have been manufactured or a temporary carrier substrate to a target substrate that forms part of the display, or "display substrate." Such small semiconductor devices may be assembled with a defined separation distance between them or closely packed together on the target substrate. Because of the small size of these devices (e.g., diameter or width smaller than 100 μm), conventional pick and place techniques are unsuitable.

SUMMARY

Embodiments relate to a pick-up tool (PUT) for picking, placing, and bonding semiconductor devices, such as LEDs, to a target substrate. Some embodiments include a system including a target substrate and a pick-up tool (PUT). The PUT includes: a first leg portion and a second leg portion, a bridge base portion between the first leg portion and the second leg portion, and a tip on the bridge base portion. The tip attaches with a semiconductor device and places the semiconductor device on the target substrate. The first and second leg portions contact the target substrate when the semiconductor device is placed on the target substrate.

Embodiments also relate to attaching a semiconductor device to a tip of a pick-up tool (PUT). The PUT includes a first leg portion and a second leg portion, a bridge base portion between the first leg portion and the second leg portion, and the tip on the bridge base portion. The method further includes placing, by the PUT, the semiconductor device on a target substrate. The first and second leg portions contact the target substrate when the semiconductor device is placed on the target substrate.

BRIEF DESCRIPTION OF THE DRAWINGS

FIG. 7 is a schematic diagram illustrating displacement sensors of a pick-up head, in accordance with one embodiment.

FIGS. 8A, 8B, and 8C are diagrams illustrating manufacturing of a bridge PUT, in accordance with one embodiment.

FIG. 9 is a flow chart of a method of manufacturing an electronic device, in accordance with one embodiment.

The figures depict embodiments of the present disclosure for purposes of illustration only.

DETAILED DESCRIPTION

Embodiments relate to a pick-up tool (PUT) for picking, placing, and bonding semiconductor devices, such as LEDs, to a target substrate. The PUT has a structure that provides stability during picking, placing, and bonding operations, and prevents contact with previously bonded semiconductor devices. The PUT is transparent, and may include alignment markers to facilitate optical alignment during the picking, placing, and bonding operations. The PUT may include displacement features to facilitate measurement of force-displacement during thermocompression bonding.

System Overview

Figure 1:
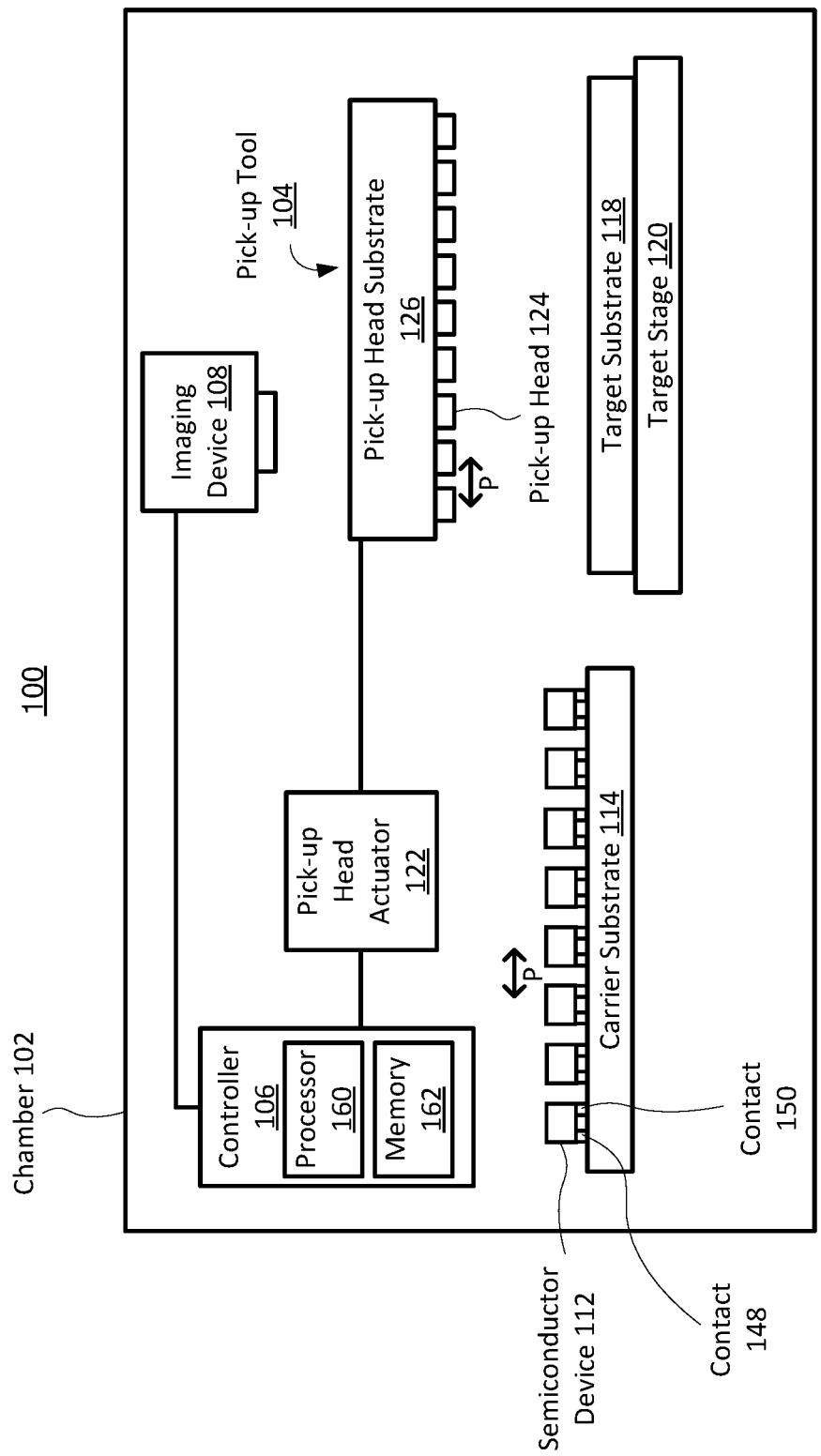
FIG. 1 is diagram illustrating a display assembly system, in accordance with one embodiment.

FIG. 1 is a diagram illustrating a display assembly system 100, in accordance one embodiment. The system 100 fabricates a display device by assembling semiconductor devices 112 from a carrier substrate 114 to a target substrate 118. In some embodiments, the semiconductor devices 112 are different color light emitting diodes (LEDs). The carrier substrate 114 may be a temporary carrier that holds the LEDs for pick up by the pick-up tool (PUT) 104. The target substrate 118 may be a display substrate of a display device including control circuits for the LEDs. The system 100 places LEDs at pixel locations of the display substrate, and then bonds the LEDs to the display substrate.

In some embodiments, the semiconductor devices 112 are μLEDs having a diameter or width smaller than 100 μm, a reduced divergence of light output, and small light emitting area. In some embodiments, the μLEDs have feature size (e.g., the diameter) and pitch (e.g., the spacing between μLEDs on the target substrate 118 or carrier substrate 114) in the sub-micron (e.g., ~0.1 um) to 10 um range. In other embodiments, the semiconductor devices 112 are vertical-cavity surface-emitting lasers (VCSELs).

The system 100 may include, among other components, a chamber 102 defining an interior environment for picking and placing semiconductor devices 112 within the chamber 102. The system 100 further includes a PUT 104, a controller 106, an imaging device 108, a pick-up head actuator 122, and a target stage 120.

The controller 106 is coupled to the imaging device 108 and the PUT 104 via the pick-up head actuator 122, and controls the operation of these components. For example, the controller 106 further causes the PUT 104 to pick up one or more semiconductor devices 112 located on the carrier substrate 114 via (e.g., Van der Waals forces or chemical) attachment, and place the one or more semiconductor devices 112 on the target substrate 118. In some embodiments, the controller includes a processor 160 and a memory 162. The memory 162 may be a non-transitory computer-readable storage medium storing instructions that when executed by the processor 160 causes the processor 160 to perform the functionality discussed herein, such as by controlling the other components of the system 100. In some embodiments, the controller 106 may include an application specific integrated circuit (ASIC), field programmable gate array (FPGA), or other type of processing circuitry.

The PUT 104 includes one or more pick-up heads 124. The PUT 104 may include an array of pick-up heads 124 attached to a pick-up head substrate 126. Each pick-up head 124 may pick up a semiconductor device 112 from the carrier substrate 114, and place the semiconductor device 112 on the target substrate 118. In some embodiments, each pick-up head 124 includes a conformable tip that adheres with a semiconductor device 112. The PUT 104 may support selective, parallel pick up and placement of multiple semiconductor devices 112 via attachment with the pick-up heads 124. In some embodiments, the system 100 includes a single pick-up head 124 rather than an array.

After picking up a semiconductor device 112, the pick-up head 124 is aligned with a target location on the target substrate 118 to place the semiconductor device 112 on the target substrate 118.

The pick-up head actuator 122 is an electro-mechanical component that controls the movement of the PUT 104 based on control signals from the controller 106. For example, the pick-up head actuator 122 may move the PUT 104, or individual pick-up heads 124, with multiple degrees of freedom including up and down, left and right, forward and back, and rotation along X, Y and Z axes. In some embodiments, the pick-up head actuator 122 may include a rotating motor, a linear motor, and/or a hydraulic cylinder.

The imaging device 108 facilitates visual alignment for pick-up of the semiconductor devices 112 from the carrier substrate 114 and placement of the semiconductor devices 112 on the target substrate 118. The PUT 104 may be formed from transparent materials such that the substrates 114, 118 and semiconductor devices 112 are visible through the PUT 104. The imaging device 108 generates images of the PUT 104 and the carrier substrate 114, and provides the images to the controller 106. The controller 106 aligns the one or more pick-up heads 124 of the PUT 104 with the one or more semiconductor devices 112 on the carrier substrate 114 based on the images, and picks up the one or more semiconductor devices 112. In another example, the imaging device 108 generates images of the one or more pick-up heads 124 of the PUT 104 and the target substrate 118, and provides the images to the controller 106. The controller 106 aligns the one or more pick-up heads 124 with the display substrate 118 based on the images, and places the one or more semiconductor devices 112 attached to the one or more pick-up heads 124 on the display substrate 118. The system 100 may include multiple imaging devices, such as an imaging device pointed at the carrier substrate 114, an imaging device pointed at the target substrate 118. In some embodiments, the imaging device 108 is attached with the PUT 104.

The system 100 may include one or more carrier substrates 114. For example, different carrier substrates 114 may carry different color LEDs. A carrier substrate 114 may hold singulated semiconductor devices 112 for transfer a target substrate 118. The system 100 may further include one or more target substrates 118. In some embodiments, such as when the target substrate 118 is a display substrate for receiving the semiconductor devices 112, the system includes a target stage 120 with a heater for thermal compression (TC) bonding of electrical contacts 148 and 150 of the semiconductor devices 112 to contacts of the target substrate 118. The heater may supply heat in connection with the PUT 104 applying a force on the semiconductor devices 112 toward the target substrate 118. In some embodiments, laser assisted bonding may be used to bond the electrical contacts 148 and 150 of the semiconductor devices 112 to contacts of the target substrate 118. For example, a laser may be directed through the PUT 104 to apply heat to the electrical contacts 148 and 150 of a semiconductor device 112 while the PUT 104 applies a force on the semiconductor device 112 to facilitate the bonding.

Figure 2:
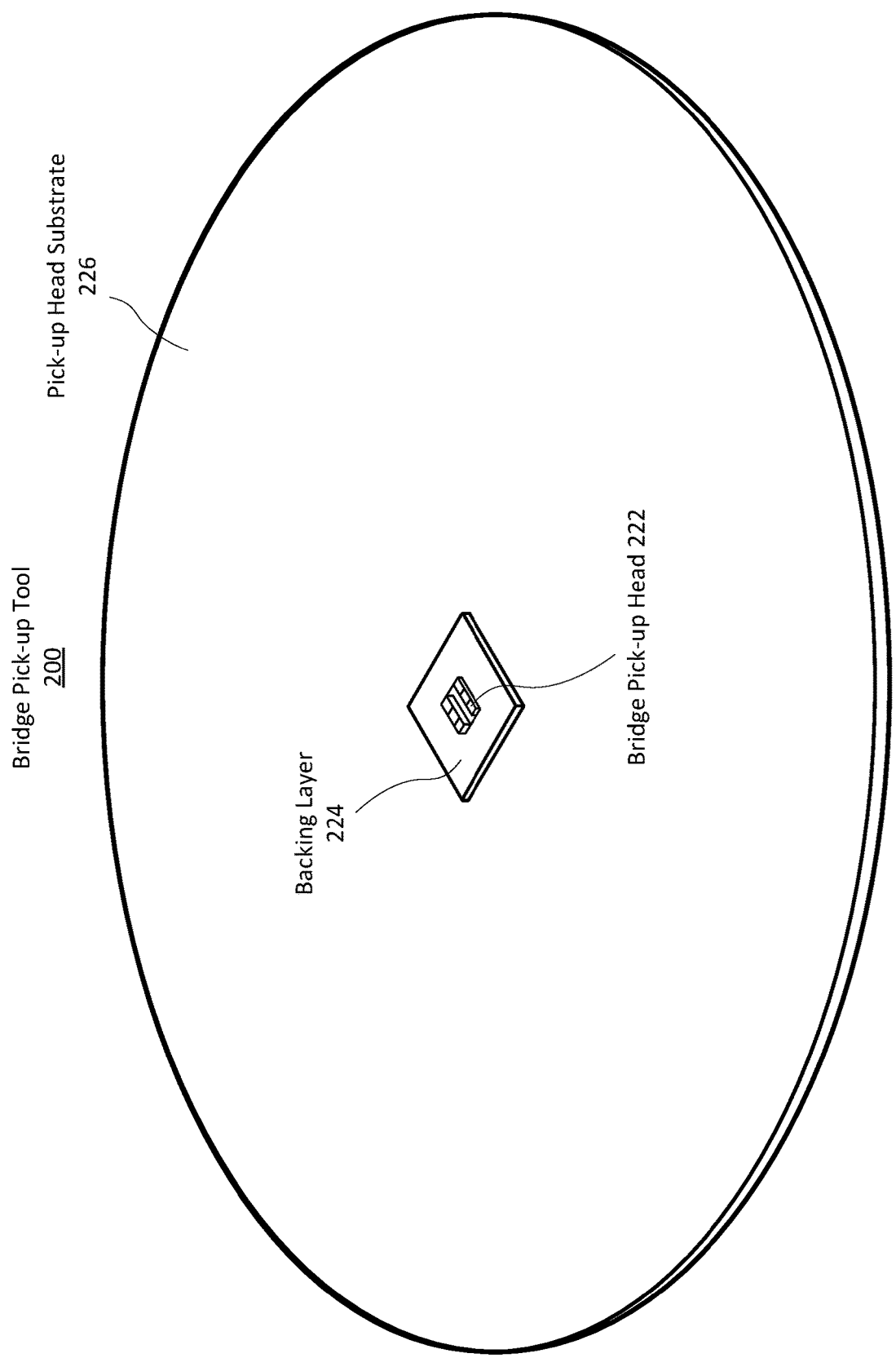
FIG. 2 is a diagram illustrating a bridge pick-up tool (PUT), in accordance with one embodiment.

FIG. 2 is a diagram illustrating a bridge pick-up tool (PUT) 200, in accordance with one embodiment. The bridge PUT 200 is an example of a PUT 104 of a display assembly system 100. The bridge PUT 200 includes a pick-up head substrate 226 that provides a support structure for one or more bridge pick-up heads 222. The pick-up head substrate 226 may be formed from a transparent, rigid material, such as a fused silica wafer.

The bridge PUT 200 further includes a backing layer 224 on the pick-up head substrate 226, and a bridge pick-up head 222 on the backing layer 224. The backing layer 224 may be formed from a transparent, conformable material. In some embodiments, the backing layer 224 is formed from an elastomer, such as polydimethylsiloxane (PDMS).

The bridge pick-up head 222 provides a surface for attachment with one or more semiconductor devices 112. The bridge pick-up head 222 may be formed from a transparent, conformable material that provides adhesion with the one or more semiconductor devices 112. In some embodiments, the bridge pick-up head 222 is formed from an elastomer that is transparent and provides enough adhesion material, such as polydimethylsiloxane (PDMS). In some embodiments, the bridge pick-up head 222 provides attachment with one or more semiconductor devices 112 via covalent bonding or Van der Waals bonding.

The pick-up head substrate 226, backing layer 224, and bridge pick-up head 222 may each be transparent to light to allow visibility through the bridge PUT 200 for facilitating alignment during pick and place operations using the imaging device 108.

Although a single bridge pick-up head 222 and backing layer 224 is shown in FIG. 2, the bridge PUT 200 may include an array of bridge pick-up heads 222 and backing layers 224 to facilitate parallel pick and place for multiple semiconductor devices 112.

Figure 3:
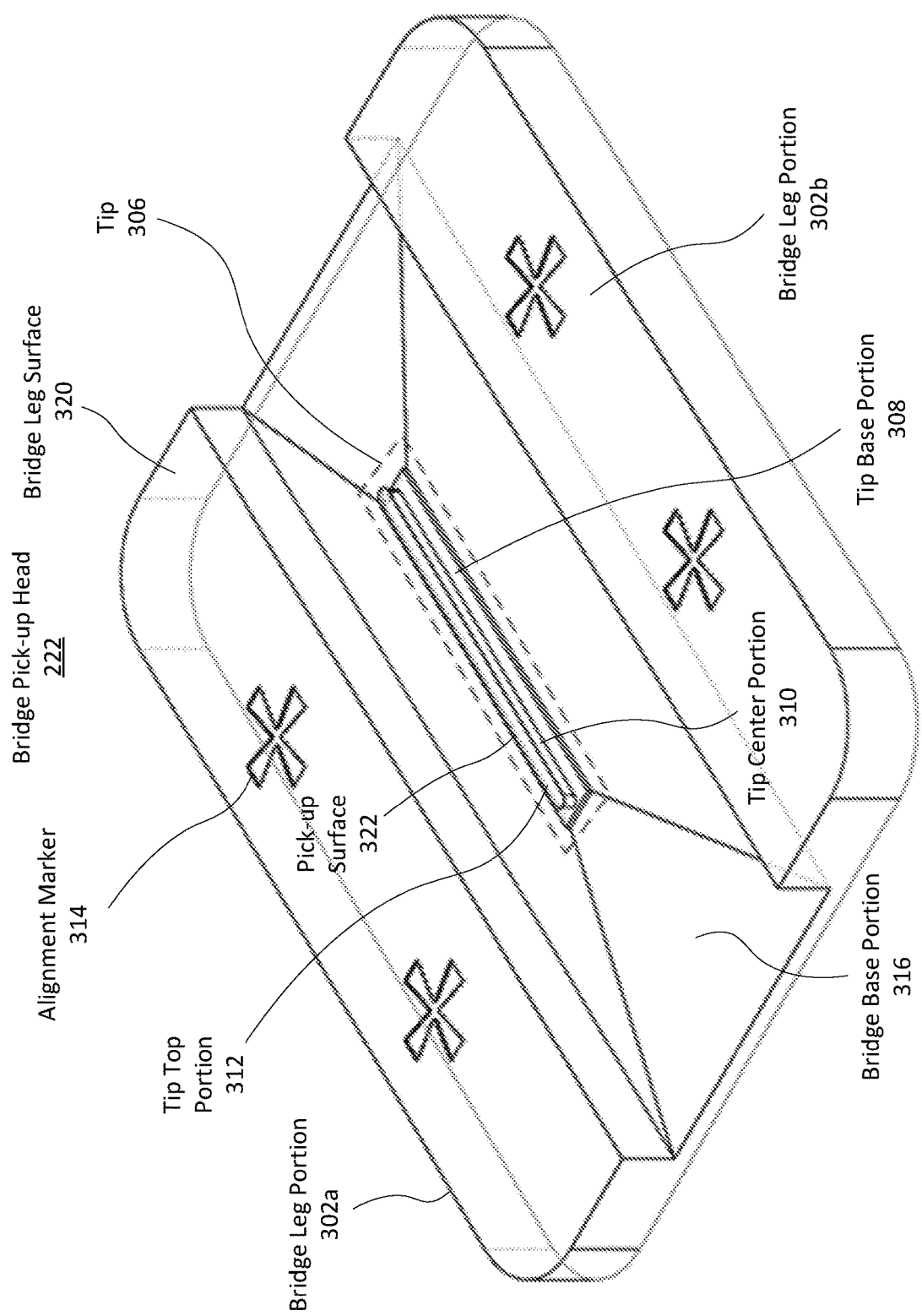
FIG. 3 is a diagram illustrating a bridge pick-up head, in accordance with one embodiment.
Figure 4:
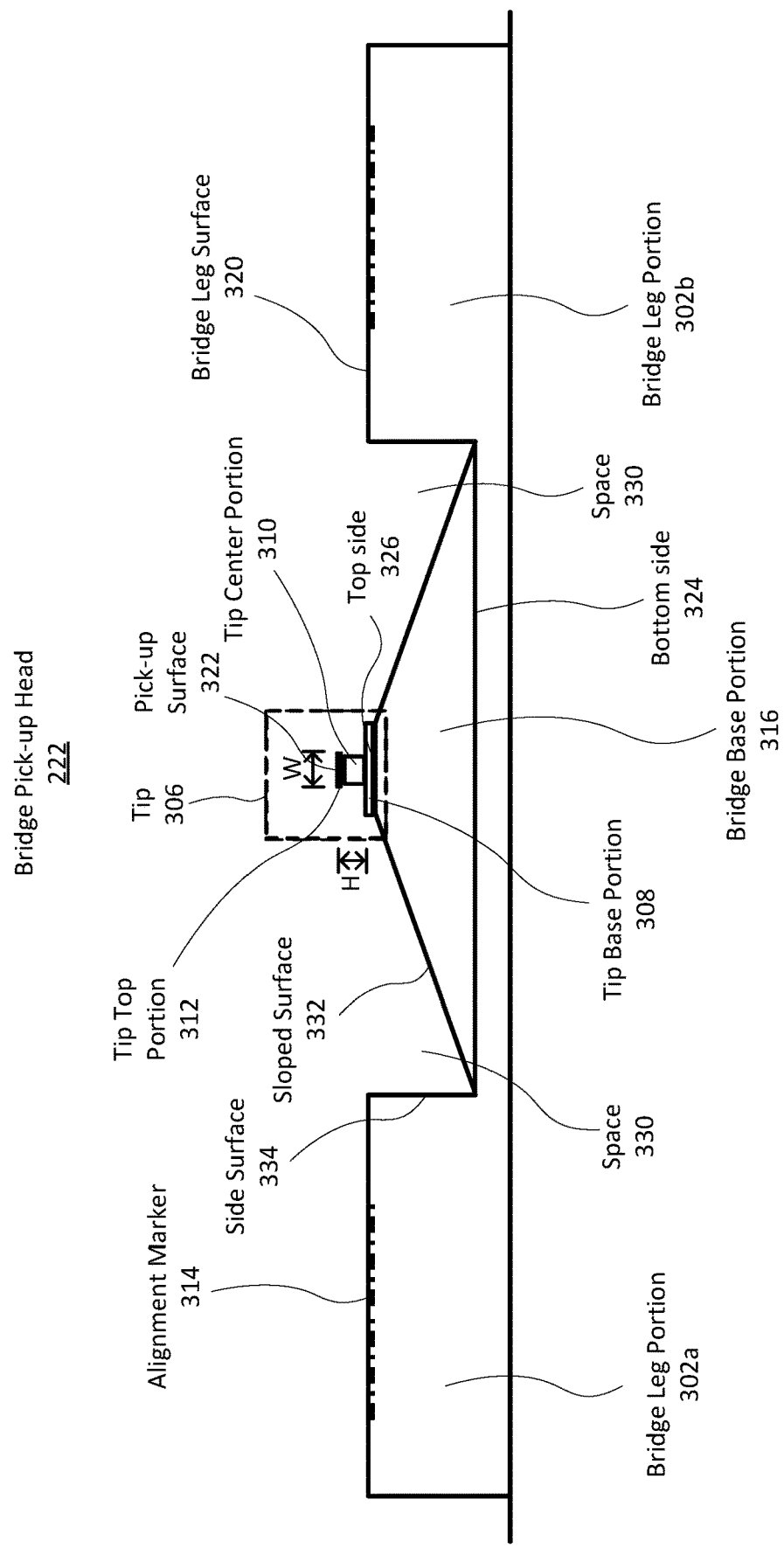
FIG. 4 is a diagram illustrating a side view of the bridge pick-up head, in accordance with one embodiment.

FIG. 3 is a diagram illustrating a bridge pick-up head 222 and FIG. 4 is a diagram illustrating a side view of the bridge pick-up head 222, in accordance with one embodiment. The bridge pick-up head 222 includes a bridge leg portion 302a, a bridge leg portion 302b, a bridge base portion 316 between the bridge leg portions 302a and 302b, and a tip 306 on the bridge base portion 316.

The tip 306 includes a tip base portion 308 on the bridge base portion 316, a tip center portion 310 on the tip base portion 308, and a tip top portion 312 on the tip center portion 310. The tip top portion 312 includes a pick-up surface 322 that attaches to a semiconductor device 112. The tip top portion 312 and the tip center portion 310 may form a pedestal having a mushroom shape, with the width of the tip top portion 312 being wider than the width of the tip center portion 310 as shown in FIG. 4. In other examples, the tip 306 may include some other shape. For example, the tip top portion 312 may form a flap is attached at one side to the tip center portion 310 and protrudes at another side of the tip center portion 310. In some embodiments, multiple tips 306 may be located on the bridge base portion 316.

The bridge leg portions 302a and 302b each includes a bridge leg surface 320. Each bridge leg surface 320 may include one or more alignment markers 314 to facilitate alignment of the bridge pick-up head 222 during pick and place operations. For example, the alignment markers 314 increase bonding accuracy of a semiconductor device 112 to a target substrate 118 during a bonding cycle. In some embodiments, alignment markers 314 are defined by recesses in the bridge leg surface 320.

The bridge base portion 316 is between the bridge leg portions 302a and 302b. As shown in FIG. 4, the bridge base portion 316 has a bottom side 324 and a top side 326, with the bottom side being larger than the top side 326, and one or more sloped surfaces 332 defined by between the bottom side 324 and the top side 326. The bridge base portion 316 may include a pyramidal, conic, or other sloped shape. Spaces 330 are defined between the one or more sloped surfaces 332 of the bridge base portion 316 and the (e.g., unsloped) side surface of the 334 of the bridge leg portions 302a and 304b. The spaces 330 prevent contact with nearby semiconductor devices 112 during pick or place operations. During a bonding cycle, the spaces 330 prevent contact or shearing with semiconductor devices 112 previously bonded to the target substrate 118.

In some embodiments, the bridge pick-up head 222 may be manufactured using a 3D printing process and a subsequent double molding step process, as discussed in greater detail in connection with FIGS. 8A, 8B, and 8C. This allows for manufacture of the bridge pick-up head 222 with sub-micrometer features, and tuning of stress distribution during the bonding of semiconductor devices 112 to the target substrate 118.

Figure 5:
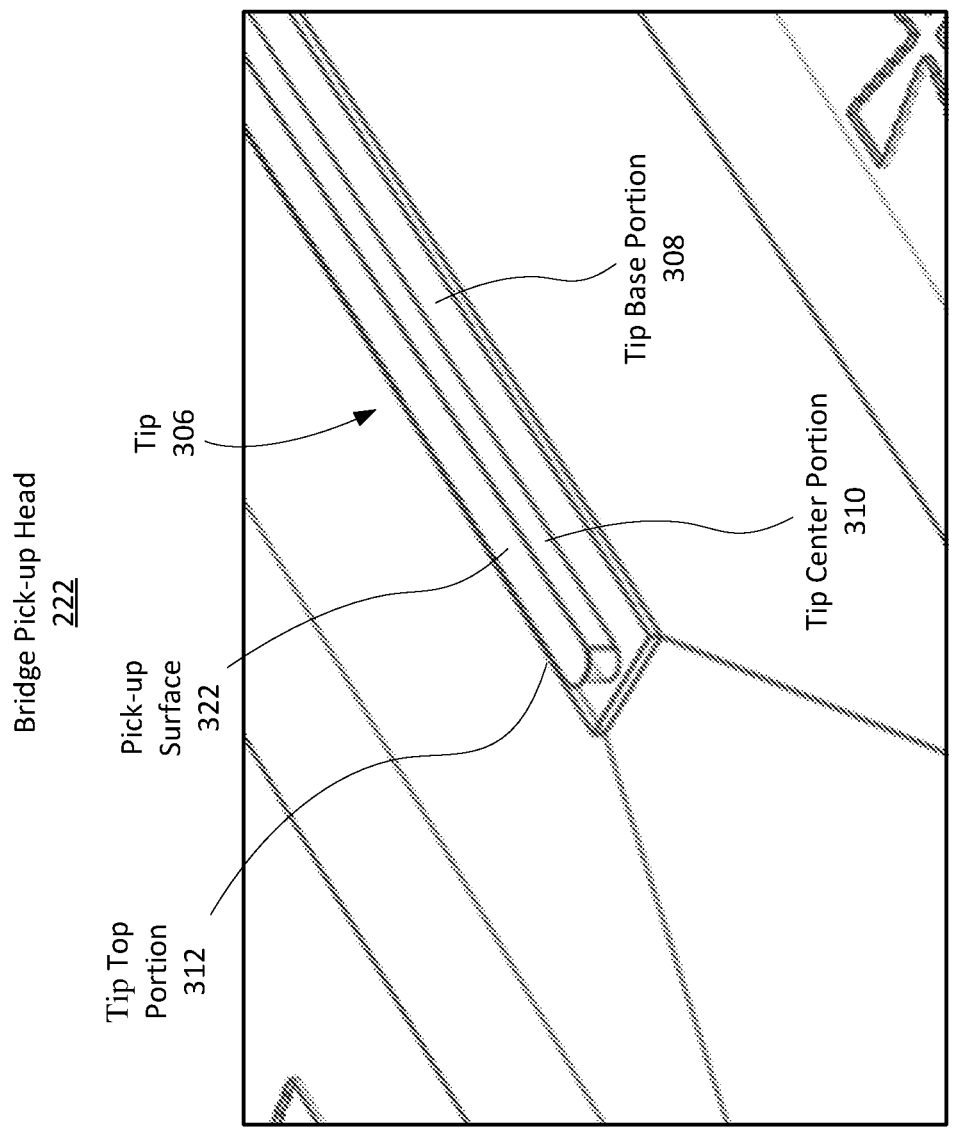
FIG. 5 is a diagram illustrating a close up view of a tip of a bridge pick-up head, in accordance with one embodiment.

FIG. 5 is a diagram illustrating a close up view of a tip 306 of a bridge pick-up head 222, in accordance with one embodiment. As shown, the tip 306 includes the tip top portion 312 including the pick-up surface 322, the tip center portion 310 below the top portion 312, and the tip base portion 308 below the tip center portion 310.

Figure 6A:
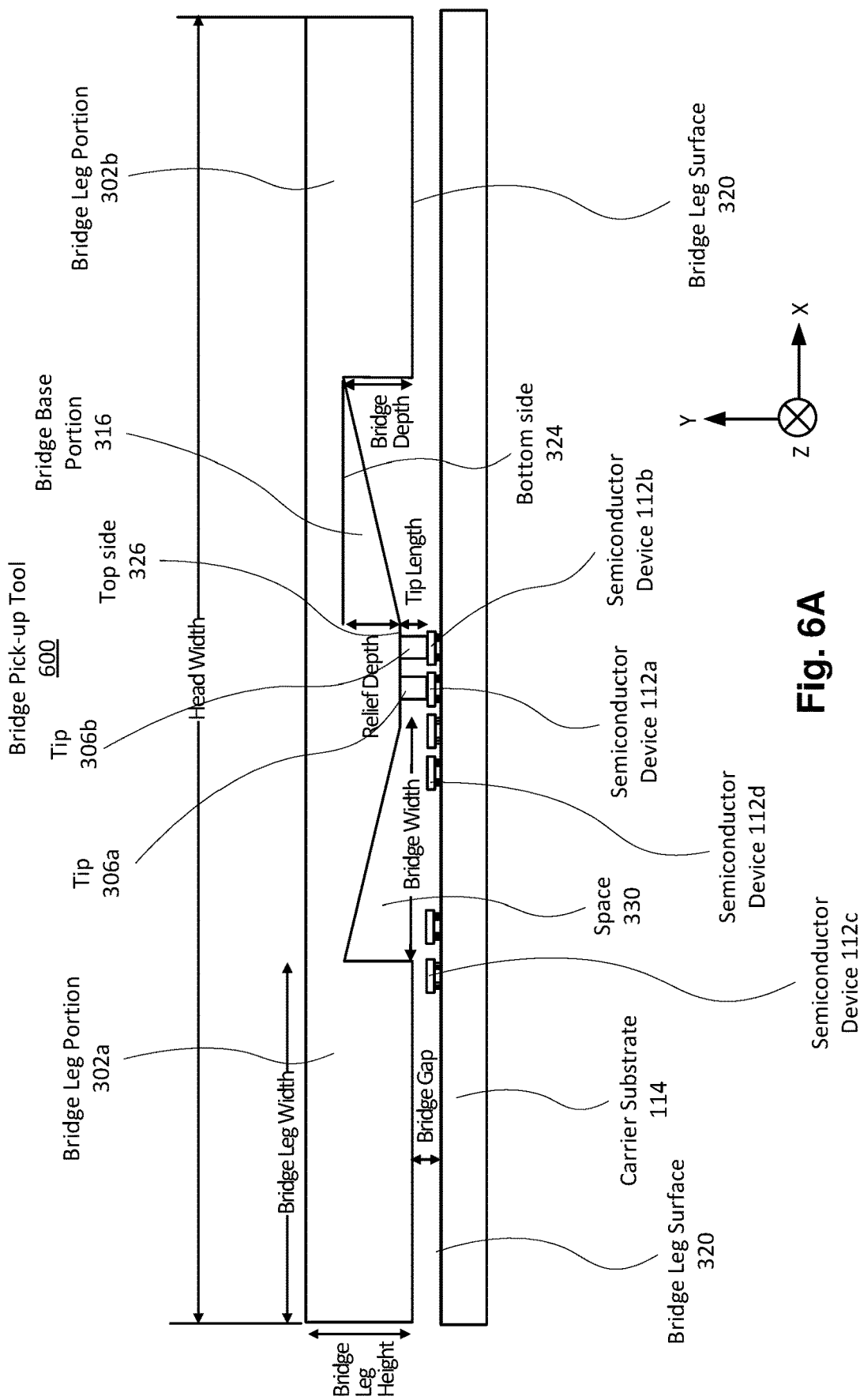
FIG. 6A is a diagram illustrating pickup of semiconductor devices using a bridge pick-up tool, in accordance with one embodiment.

FIG. 6A is a diagram illustrating pickup of semiconductor devices using a bridge PUT 600, in accordance with one embodiment. The bridge PUT 600 is like the bridge PUT 200, but includes multiple tips 306a and 306b attached to the bridge base portion 316.

In a pick, place, and bonding cycle, the bridge PUT 600 picks up the semiconductor devices 112a and 112b from the carrier substrate 114, places the semiconductor devices 112a and 112b on the target substrate 118, and bonds the contacts of the semiconductor devices 112a and 112b to contacts 602 of the target substrate 118.

As shown in FIG. 6A, the bridge PUT 600 picks up the semiconductor devices 112a and 112b from the carrier substrate 114 by contacting the semiconductor devices 112a and 112b with the tips 306a and 306b, respectively. The contact between each tip 306 and a semiconductor device 112 results in an (e.g., adhesive) attachment. In some embodiments, an elastomeric layer is formed on the semiconductor device 112 to facilitate the attachment.

A light contact between the tip 306 and the semiconductor device 112 may be sufficient to achieve the attachment, and thus there is little or no deformation in the bridge PUT 600 during the pick-up. The bridge PUT 600 is at a rest state or close to a rest state. In the rest state, the tips 306 of the bridge PUT 600 extend beyond the bridge leg portions 302a and 302b. A bridge gap is defined between the bridge leg portions 302a and 302b the carrier substrate 114. The bridge gap prevents contact with a non-selected semiconductor devices 112c on the carrier substrate 114. Furthermore, a space 330 defined by a bridge depth (defined from the bridge leg surface 320 to the joint of the bridge leg portion 302 at the bottom side 324 of the bridge base portion 316) and a bridge width (defined from end of the top side 326 to the joint of the bridge leg portion 302) prevents contact with a non-selected semiconductor device 112d on the carrier substrate 114 near the selected semiconductor devices 112a and 112.

Once the semiconductor devices 112a and 112b are attached to the bridge PUT 600, the bridge PUT 600 may be separated from the carrier substrate 114 (e.g., lifted along the Y-axis) to remove the semiconductor devices 112a and 112b from the carrier substrate 114.

Figure 6B:
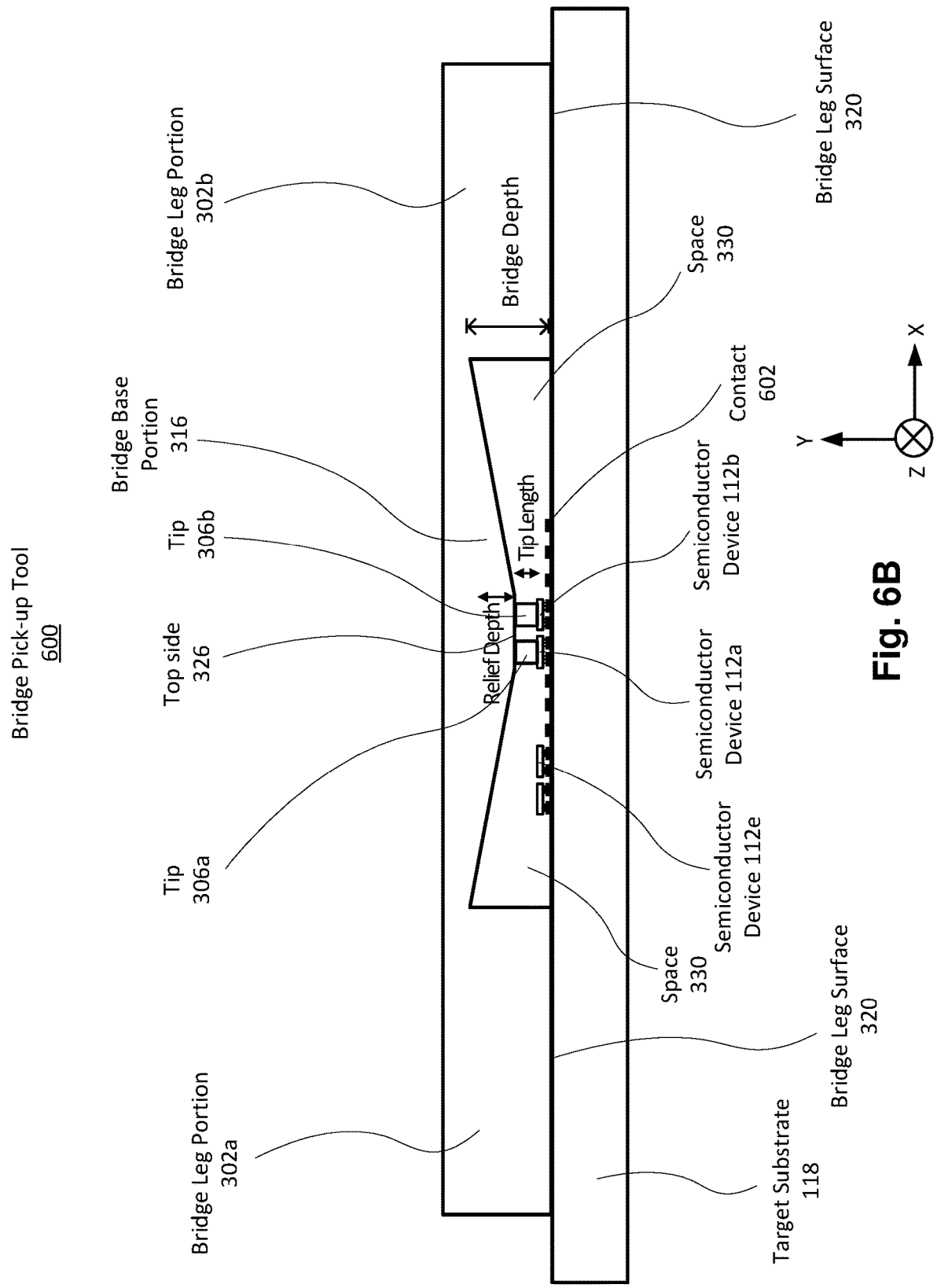
FIG. 6B is a diagram illustrating a placement and bonding of semiconductor devices using a bridge pick-up tool, in accordance with one embodiment.

FIG. 6B is a diagram illustrating a placement and bonding of semiconductor devices using the bridge PUT 600, in accordance with one embodiment. The bridge PUT 600 attached with the semiconductor devices 112a and 112b are aligned with target locations on the target substrate 118. The contacts of the semiconductor devices 112a and 112b are placed on contacts 602 of the target substrate 118.

The bonding process may include a thermocompression bonding, with force being applied on the semiconductor devices 112a and 112b toward the target substrate 118 by the bridge PUT 600 (e.g., along the Y axis). The applied force results in the bridge PUT 600 being in a compressed state as shown in FIG. 6B, with the bridge base portion 316 and/or tips 306 being compressed (e.g., reducing the relief depth and/or tip length), and the bridge leg surface 320 of each bridge leg portion 302a and 302b contacting the target substrate 118. While the compression is applied by the bridge PUT 600, heat may be applied (e.g., by the target stage 120 that holds the target substrate 118) to perform the thermocompression bonding. The thermocompression bonding results in the contacts of the semiconductor devices 112a and 112b being bonded to the contacts 602 of the target substrate 118.

The contact between the bridge leg portion 302a and 302b and the target substrate 118 reduces relative lateral motion (along X-Z plane) between the bridge PUT 600 and the target substrate 118, and holds the semiconductor devices 112a and 112b in place. The bridge leg portion 302a and 302b act as anchor points by adhering to the target substrate 118. To adhere the bridge leg portion 302a and 302b to the target substrate 118, a load (also referred to as a pre-load) is applied by the bridge PUT 600 to push the bridge leg portions 302a and 302b against the target substrate 118 until the bridge leg surfaces 320 of the surface of the bridge leg portions 302a and 302b contact the target substrate 118 (bridge gap=0).

In the rest state shown in FIG. 6A, the tips 306 extends below the bridge leg portions 302a and 302b to prevent contact with the carrier substrate 114 or semiconductor devices 112 that are not to be picked up. Otherwise, there is a chance that a bridge leg portion 302a or 302b would unintentionally pick up a semiconductor device. In the compressed state shown in FIG. 6B, the bridge leg portions 302 and 302b extend below the tips 306 to allow the bridge leg surfaces 320 to contact the target substrate 118.

The bridge PUT 600 defines space 330 between the bridge leg portion 302a and the tip 306a, and another space 330 between the bridge leg portion 302b and the tip 306b. The space 330 prevents contact with or shearing of previously bonded semiconductor devices, such as the semiconductor device 112e. In some embodiments, the bridge depth may be greater than 30 um, such as 60 um.

FIG. 7 is a schematic diagram illustrating displacement features 702 of a bridge pick-up head 700, in accordance with one embodiment. The bridge leg portion 302 of a bridge pick-up head 700 may include displacement features 702 defined at the bridge leg surface 320. The displacement features 702 provide for optical determination of force-displacement of the bridge pickup head 700 during pick, place, or bonding of a semiconductor device 112. In some embodiments, the displacement features 702 are discrete cones or semi-spheres between 1 um and several ums deep distributed on one or more bridge leg portions 302. The displacement features 702 provide for assessment of deformation and stress-strain state. Based on the visco-elastic properties of the material of the pick-up head 700 (e.g., PDMS), the amount of pressure that is being applied by the pick-up head 700 may be determined based on the amount of deformation on the displacement features 702. Different amounts of deformation are shown for the displacement features 702 in FIG. 7. In some embodiments, a bridge leg portion 302 may include an array of displacement features 702, with more compression of a displacement feature 702 at a particular location of the bridge leg portion 302 indicating more force-displacement at the respective location.

Figure 8B:
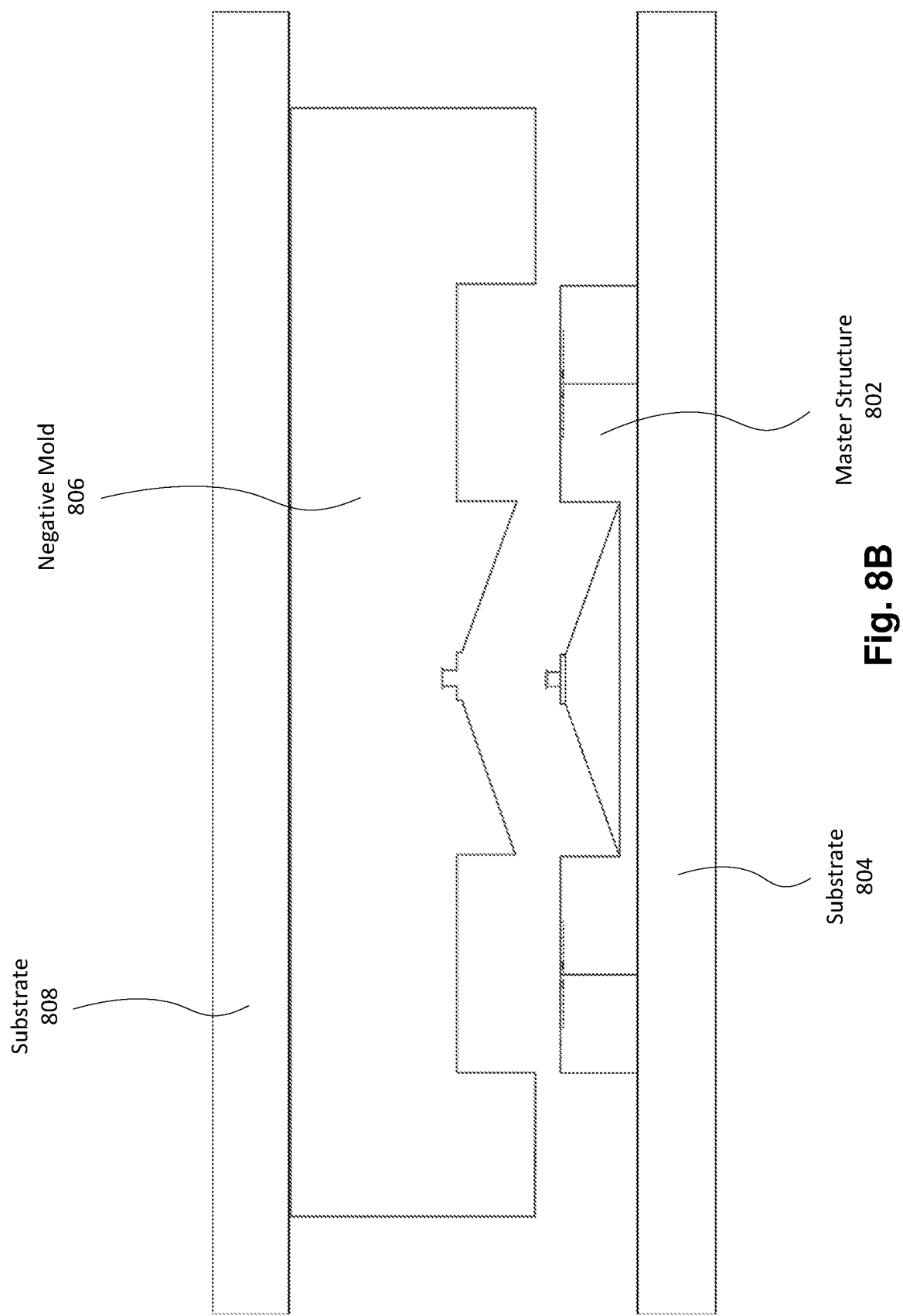

FIGS. 8A, 8B, and 8C are diagrams illustrating manufacturing of a bridge PUT, in accordance with one embodiment. The bridge PUT may be manufactured using a 3D printing process and a subsequent double molding step process. With reference to FIG. 8A, a master structure 802 for a bridge pick-up head is printed on a substrate 804. The master structure 802 may be made of a photoresist material, such as a negative photoresist material. In some embodiments, a 2-photon polymerization (2pp) printing process may be used to print the master structure 802 on the substrate 804.

With reference to FIG. 8B, a first molding is performed to create a negative mold 806 on a substrate 808 from the master structure 802. The negative mold 806 may be made of PDMS. The negative mold 806 may be formed by molding the PDMS with the master structure 802 and baking the molded PDMS in an oven. To facilitate safe peel off the negative mold 806 from the master structure 802 after the baking, the surface of the master structure 802 may be functionalized prior to the molding. For example, an anti-stick silanization process may be applied to the surface of the master structure 802.

With reference to FIG. 8C, a second molding is performed to create a bridge pick-up head 822 on a backing layer 824 and pick-up head substrate 826. The bridge pick-up head 822 may be made of PDMS. The bridge pick-up head 822 may be formed by molding PDMS with the negative mold 806 and baking the molded PDMS in an oven. To facilitate safe peel off the negative mold 806 from the bridge pick-up head 822 after the baking, the surface of the negative mold 806 may be functionalized prior to the molding. For example, an anti-stick silanization process may be applied to the surface of the negative mold 806.

FIG. 9 is a flow chart illustrating a method of manufacturing an electronic device, in accordance with one embodiment. The method of manufacturing may be performed by a display assembly system 100 to manufacture a display. Here, the semiconductor devices are LEDs. In one example, the light emitting diodes are µLEDs. The method of manufacturing may include fewer or additional steps, and steps may be performed in different orders.

One or more tips of the bridge PUT may be aligned with one or more selected semiconductor devices on the carrier substrate, and then brought into contact with the selected semiconductor devices for attachment. Then, a bridge PUT picks up 905 a semiconductor device on a carrier substrate. A light contact may be used where there is little or no deformation in the bridge PUT. The tips of the bridge PUT extend beyond the bridge leg portions to define a bridge gap between each bridge leg portion and the carrier substrate. The bridge gaps prevent contact with non-selected semiconductor devices on the carrier substrate.

In some embodiments, the bridge PUT is transparent to allow an imaging device to generate images of the bridge PUT and underlying carrier substrate using light transmitted through the bridge PUT. In some embodiments, the bridge PUT may include alignment markers to facilitate the alignment.

The bridge PUT places 910 the semiconductor device on a target substrate. The bridge PUT attached with the one or more semiconductor devices are aligned with one or more respective target locations on the target substrate. The contacts of the semiconductor devices are placed on contacts of the target substrate.

In some embodiments, the bridge PUT is transparent to allow an imaging device to generate images of the bridge PUT and underlying target substrate using light transmitted through the bridge PUT. In some embodiments, the bridge PUT may include alignment markers to facilitate the alignment.

The bridge PUT applies 915 a force on the semiconductor device toward the target substrate to facilitate a thermocompression bonding to bond the semiconductor device on the target substrate. The force may result in compression of the bridge base portion and/or tip of the bridge PUT, and may further result in the bridge leg surfaces of each bridge leg portion of the bridge PUT to contact the target substrate. The contact between the bridge leg portions and the target substrate holds the semiconductor devices in place during the bonding. In connection with the application of the force by the bridge PUT, heat is applied (e.g., by a target stage holding the target substrate) to bond the contacts of the one or more semiconductor devices to the contacts of the target substrate.

In some embodiments, the bridge PUT may include displacement features that provide for optical determination of force-displacement of the bridge pickup head during the pick-up, placement, or bonding of the semiconductor device. The displacement features facilitate fine control for the different amounts of force applied during the pick up and placement/binding steps.

The method of FIG. 9 was explained with reference to a single bonding cycle where one or more semiconductor devices are placed on the target substrate. Multiple bonding cycles may be used to complete the manufacture of the electronic device. For example, the electronic device may be a display device and the semiconductor devices may be LEDs. Multiple bonding cycles may be used to place LEDs of different color on a target display substrate of the display device. In some embodiments, one or more bonding cycles may be used to place LEDs of different colors on different display substrates, and multiple arrays of displays substrates are combined to form the display device.

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A system, comprising:
   a target substrate; and
   a pick-up tool (PUT), including:
      a first leg portion and a second leg portion;
      a bridge base portion between the first leg portion and the second leg portion, the bridge base portion compressed when a force is applied on a semiconductor device; and
      a tip protruding away from the bridge base portion, the tip configured to attach with the semiconductor device and place the semiconductor device on the target substrate, the first and second leg portions contacting the target substrate when the semiconductor device is placed on the target substrate, the bridge base portion and the tip apply the force on the semiconductor device toward the target substrate, the first and second leg portions extend below the tip when the bridge base portion is compressed to adhere with the target substrate and hold the semiconductor device to a target location on the target substrate, the tip extending below the first and second leg portions when the bridge base portion is uncompressed.

2. The system of claim 1, wherein the PUT includes a conformable material.

3. The system of claim 1, wherein first space is provided between the bridge base portion and the first leg portion, second space is provided between the bridge base portion and the second leg portion, and another semiconductor device previously placed on the target substrate fits within the first space or the second space when the first and second leg portions contact the target substrate.

4. The system of claim 1, wherein the PUT includes:
   a substrate;
   a backing layer on the substrate; and
   a bridge pick-up head including the first and second leg portions, the bridge base portion, and tip, the bridge pick-up head being on the backing layer.

5. The system of claim 4, wherein the substrate is formed from a fused silica wafer, the backing layer is formed from polydimethylsiloxane (PDMS), and the bridge pick-up head is formed from PDMS.

6. The system of claim 1, wherein the PUT is transparent to light.

7. The system of claim 6, further comprising an imaging device configured to generate an image using light transmitted through the PUT to align the semiconductor device attached with the PUT with a target location on the target substrate.

8. The system of claim 1, wherein at least one of the first and second bridge leg portions include an alignment marker.

9. The system of claim 1, wherein at least one of the first and second bridge leg portions include a displacement feature that deforms to indicate an amount of pressure applied by the PUT.

10. The system of claim 1, further comprising a target stage that holds the target substrate, the target stage configured to apply heat to the target substrate when the first and second leg portions contact the target substrate to bond contacts of the semiconductor device with contacts of the target substrate.

11. The system of claim 1, further comprising carrier substrate, and wherein the PUT is configured to pick up the semiconductor device from the carrier substrate.

12. The system of claim 11, wherein the bridge base portion is uncompressed and the tip extends below the first and second leg portions when the tip contacts and attaches with the semiconductor device on the carrier substrate.

13. A method, comprising:
   attaching a semiconductor device to a tip of a pick-up tool (PUT), the PUT including:
      a first leg portion and a second leg portion extending below the tip when a bridge base portion is compressed to adhere with a target substrate and hold the semiconductor device to a target location on the target substrate;
      the bridge base portion between the first leg portion and the second leg portion, the bridge base portion and the tip apply a force on the semiconductor device toward the target substrate, and the bridge base portion is compressed when the force is applied on the semiconductor device; and
      the tip protruding away from the bridge base portion, the tip extending below the first and second leg portions when the bridge base portion is uncompressed; and
   placing, by the PUT, the semiconductor device on the target substrate, the first and second leg portions contacting the target substrate when the semiconductor device is placed on the target substrate.

14. The method of claim 13, wherein the PUT includes a conformable material.

15. The method of claim 13, wherein first space is provided between the bridge base portion and the first leg portion, second space is provided between the bridge base portion and the second leg portion, and another semiconductor device previously placed on the target substrate fits within the first space or the second space when the first and second leg portions contact the target substrate.

16. The method of claim 13, wherein:
   the PUT is transparent to light; and
   the method further includes generating an image using light transmitted through the PUT to align the semiconductor device attached with the PUT with a target location on the target substrate.

* * * * *